METHOD OF ETCHING PHOTOENGRAVING PLATES AND ETCHING SOLUTION USED THEREFOR
Filed Aug. 4, 1961
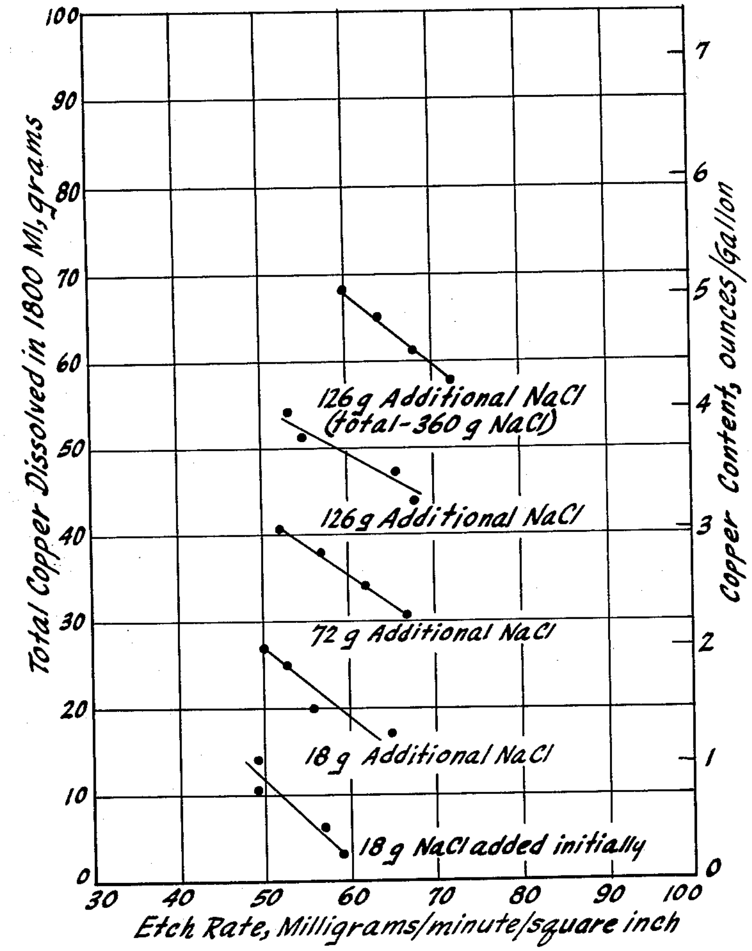
INVENTOR.
REXFORD W. JONES
BY Milton Zucker
[signature]
Frank Ianno
ATTORNEY United States Patent Office 3,216,873
Patented Nov. 9, 1965

3,216,873

METHOD OF ETCHING PHOTOENGRAVING PLATES AND ETCHING SOLUTION USED THEREFOR

Rexford W. Jones, Columbus, Ohio, assignor, by mesne assignments, to FMC Corporation, New York, N.Y., a corporation of Delaware Filed Aug. 4, 1961, Ser. No. 129,359
9 Claims. (Cl. 156—14)

This invention relates to the production of printing plates, and to etch solutions particularly useful therein. More particularly, it relates to the production of copper photoengraved plates by the use of aqueous persulfate solutions containing added chlorides.

Copper plates for printing are conventionally photoengraved—that is, a sensitized coating which can be hardened by light, is put on the plate, the coating is exposed to light through a negative line or halftone transparency containing the subject to be printed and developed. Thus the resist which has not been hardened by light is washed away so that the metal is protected in the spots where printing is to be done and is unprotected in the non-printing areas. The unprotected metal is then etched down a sufficient distance so that the protected dots of the engraving are at a sufficient level above the non-printing areas so that a clean print will result. In such a process it is important that the copper be etched away predominantly in a downward direction, and that there be a minimum of sidewise etching to undercut the printing dots.

In the many years since photoengraving was first developed ferric chloride solutions have been used almost exclusively as the etch, mainly because experience has demonstrated that high quality work can be done by skilled operators. This is despite its very corrosive nature, and the fact that great care must be used in handling it; in particular the fumes must be controlled and care must be taken to avoid contact with the skin.

When printed circuits began to be used in substantial numbers the disadvantages of ferric chloride led investigators into the use of other etches which were less hazardous. As a result of this very considerable activity, the printed circuit industry has swung in large measure to the use of aqueous persulfate solutions, in particular to mercury catalyzed etches such as are described in the Margulies et al. Patent 2,978,301 issued on April 4, 1961. The success of these materials in the printed circuit field has prompted a reinvestigation of their utility in the reproduction of photoengravings.

Unfortunately aqueous persulfate solutions, with or without catalysts such as mercury, are not useful in the production of photoengravings, whether the etching is done in trays or by splashing the etching solution against the plate by means of a rotating paddle. The principal difficulty encountered with persulfate solutions is a micrograininess as compared with the almost mirror-smooth etch obtained with ferric chloride. The graininess appears to be due to a preferential attack on the copper at the grain boundaries. Furthermore, these attacks at the grain boundaries result in a marked sideward etch as compared to a downward etch, resulting in undercutting of the dots, and actual elimination of many of the dots in the high-light areas. This is generally described as a low etch factor—that is, a low ratio of downward etch to sideward etch as measured in actual distance. Where ferric chloride solutions have etch factors which are characteristically, in laboratory equipment, of the order of 1.5 and higher, in the shadows and middletones, and 1.0 or more in the high-lights, persulfate solutions run from about 1.0 to 1.5 in the shadow areas, somewhat lower in the middletones and less than 1.0 in the high-lights.

A further difficulty encountered with persulfate etching is the formation of a grayish film or smut on the surface of the copper. This appears to be due to the fact that almost all photoengraving copper has a minor quantity of silver which, when attacked by persulfate, produces this gray-silvery film. The deposit tends to inhibit further etching and is objectionable for this reason, and because of its appearance.

Another difficulty encountered is the tendency of copper salts to deposit in small crystals as their concentration builds up. This is particularly troublesome with ammonium persulfate, but less troublesome with sodium persulfate. However, with any persulfate, one must either use a less concentrated solution with the disadvantage of a lower etch rate, or face the problem of crystallization.

With tray etching, still a further problem is the accumulation of gas bubbles on the surface of the copper, which contributes to localized pitting. This problem is not present with ferric chloride etching.

The final problem is that of etch rate. A typical 42° Bé. ferric chloride solution will etch copper at 95° F. at a rate of about 90 milligrams per minute per square inch. As the concentration of the copper in the etching solution builds up to about 8 ounces per gallon, the etch rate will about be cut in half. Under similar conditions for 25% ammonium persulfate with 5 parts per million of mercury catalyst, the initial rate of 65 milligrams per square inch falls to 25 milligrams per minute per square inch after only 4½ to 5 ounces of copper have been dissolved per gallon. In tray etching the rates are considerably lower, but the same loss of activity occurs.

I have discovered that the disadvantages of persulfate in the production of photoengravings can be overcome by using in combination with the aqueous persulfate solution, containing about 5 to 50% of persulfate, a quantity of a soluble chloride in the range of about 1 to 20%. Despite the known highly corrosive action of chlorides, their use in conjunction with persulfate reduces the attack on grain boundaries sufficiently so that smooth plates are obtained, etch factors are achieved as good as or better than those obtained with ferric chloride etches, and smut is eliminated. Furthermore, etch rates can be maintained by the simple expedient of adding the chloride in increments during the course of the reaction.

The problem of gas evolution in tray etching can likewise be overcome by adding to the etches sulfur containing organic compounds such as thiourea and aryl sulfonic acids.

Just why the chlorides eliminate the preferential attack at the grain boundaries is not understood. However, the resultant etch solutions produce smooth etched metal, have desirably high etch factors, particularly in the shadows and middletones, provide means to control the rate of etch, are easier to handle and are far less troublesome and have some economic advantages over ferric chloride etches. The only disadvantages are, as compared with ferric chloride etches, the necessity of maintaining control of the solution and for adding chloride during the course of the etch.

In preparing the solutions I can use any of the water soluble persulfates. The most common of these are the ammonium and sodium salts, and these are preferred because they have the highest solubility in water. Other alkali metal salts can be used.

I may use any of the chlorides which will not precipitate the persulfate out of solution. Ammonium chloride and the alkali metal chlorides are the most desirable materials to use, but such chlorides as magnesium, mercuric and stannic chlorides, for example, are just as effective as are ferric chloride and hydrochloride acid (which have, however, a harmful effect on some photoresisits).

The persulfate solution may be catalyzed with mercury and the like catalysts, as disclosed in Patent 2,978,301, but is preferably uncatalyzed since the catalyzing metals have little effect in the presence of 1% or more of chlorides.

The effect of the addition of chlorides in the etch can be observed by referring to the accompanying drawing, which shows the effect of the addition of chlorides on the etch rate of a 15% ammonium persulfate solution containing 5 parts per million of mercury metal in solution, with the stepwise addition of sodium chloride. The etching was done at 95° F. in a laboratory splash etcher containing 1800 milliliters of etch solution. One percent of sodium chloride (18 grams) was added initially and the etch rate observed to be 60 milligrams per minute per square inch. As the copper content of the soltuion rose to 1 ounce per gallon, the etch rate dropped to 50. If In running this stepwise reaction it is desirable to start with a minor portion of the total chloride, say from 1 to 10% based on the total etch and preferably from 1 to 4%, and thereafter add the chloride as desired to keep the etch rate at a reasonably high level. It will be noted that the total concentration of chloride in such cases will run up to the total maximum chloride content ordinarily useful.

A considerable amount of work was also done in determining etch factors, in comparison with ferric chloride solutions. Again the laboratory splash etcher was used, with 1800 milliliters of solution. In Table I, the composition of the etch, the amount of chloride added, the etch time and the etch factor for a reverse line area, and high-light, middletone and shadow dot areas are given, as well as the actual depth of etch and tonal pass (sidewise etch) in the dot areas.

*Table 1.—Comparative etching characteristics of ferric chloride and persulfates in laboratory splash etcher*

[Depth and Tonal Loss Given in Mils]

| Etch | Total Salt, Percent | Time, min. | Reverse Line Etch Factor | Highlight | | | Middletone | | | Shadow | | |
|---|---|---|---|---|---|---|---|---|---|---|---|---|
| | | | | Depth | Tonal Loss | Etch Factor | Depth | Tonal Loss | Etch Factor | Depth | Tonal Loss | Etch Factor |
| 42° Bé $FeCl_3$ | -------- | 4 | 2.0 | -------- | -------- | (1) | 2.9 | 1.9 | 1.5 | 1.7 | 1.1 | 1.5 |
| | -------- | 3 | 1.8 | 2.0 | 1.9 | 1.0+ | 2.2 | 1.6 | 1.4 | 1.6 | 1.0 | 1.6 |
| | -------- | 3 | 2.2 | 1.6 | 1.7 | 1.0− | 2.0 | 1.2 | 1.6 | 1.4 | 0.9 | 1.5 |
| | -------- | 3⅓ | 1.7 | 1.5 | 1.5 | 1.0 | 2.1 | 1.4 | 1.5 | 1.6 | 1.1 | 1.4 |
| 25% $(NH_4)_2S_2O_8$ | -------- | 8 | 1.2 | -------- | -------- | (1) | 3.3 | 3.1 | 1.0+ | 3.2 | 2.0 | 1.6 |
| | -------- | 10 | 1.2 | -------- | -------- | (1) | 3.2 | 2.7 | 1.1 | 2.5 | 2.1 | 1.2 |
| 25% $Na_2S_2O_8$ | -------- | 8 | 1.4 | -------- | -------- | (1) | 3.1 | 2.3 | 1.4 | 2.7 | 1.8 | 1.5 |
| | -------- | 10 | 1.2 | 2.3 | 2.8 | 0.8 | 2.8 | 2.3 | 1.2 | 2.2 | 1.8 | 1.1 |
| 15% $(NH_4)_2S_2O_8$+NaCl | 2 | 6 | 2.1 | 2.6 | 2.4 | 1.1 | 2.7 | 1.4 | 1.9 | 2.3 | 1.0 | 2.3 |
| | 6 | 6 | 2.0 | 2.8 | -------- | (2) | 2.9 | 1.6 | 1.8 | 2.2 | 1.2 | 1.8 |
| | 13 | 5 | 2.3 | 2.4 | 2.4 | 1.0 | 2.8 | 1.3 | 2.2 | 2.2 | 1.1 | 2.0 |
| 25% $Na_2S_2O_8$+$NH_4Cl$ | 2 | 6 | 1.6 | 2.6 | 2.6 | 1.0 | 2.6 | 1.7 | 1.5+ | 2.4 | 1.4 | 1.7 |
| | 6 | 4⅔ | 2.0 | Defective resist in this area | | | 2.7 | 1.6 | 1.7 | 2.1 | 1.0 | 2.1 |
| | 13 | 4⅓ | 2.2 | 2.3 | 2.0 | 1.1+ | 2.5 | 1.4− | 1.8 | 2.0 | 0.94 | 2.1 |
| 20% $Na_2S_2O_8$+$NH_4Cl$ | 2 | 5 | 1.7 | 2.4 | 1.95 | 1.2 | 2.4+ | 1.45 | 1.7− | 2.0 | 1.25 | 1.6 |
| | 5 | 4⅔ | 2.4 | 2.3 | 1.9 | 1.2 | 2.7 | 1.25 | 2.2 | 2.2 | 1.05 | 2.1 |
| | 10 | 4⅔ | 2.3 | 2.2 | 2.0 | 1.1 | 2.6 | 1.25 | 2.1 | 2.3 | 1.15 | 2.0 |

1 Etched out.
2 Mostly etched out.

this had been continued, the etch rate would have continued to well under half the original figure by the time the copper content was up to 4 to 5 ounces of copper content per gallon. However, another 1% of sodium chloride was added at this point and the etch rate rose to about 65, dropped down again to 50 at a copper content of 2 ounces per gallon. At this point 4% more chloride was added, to bring the etch rate to about 67. This dropped to 52 at 3 ounces per gallon, was increased to 68 by the addition of another 7% of sodium chloride, fell to about 53 at 4 ounces of copper per gallon, was carried up to 72 by the addition of another 7% of sodium chloride and then fell to 60, the original rate, at 5 ounces of copper per gallon.

Essentially the same results are obtained in this test for etch rate with 15% ammonium persulfate containing no mercury.

In a similar run with a 20% sodium persulfate solution 2% of ammonium chloride was added to get an original etch rate of about 75 milligrams per minute per square inch. This fell to about 55 when the copper content was up to 2 ounces per gallon, and was raised to 72 by the addition of another 3% of ammonium chloride. As the copper concentration built up to 4 ounces per gallon, the rate dropped to 50. An additional 5% of ammonium chloride at this time brought the etch rate up to 65 and this fell to just under 40 at a copper concentration of 6 ounces per gallon.

Obviously this stepwise addition of chloride would permit a photoengraver to keep his etch reasonably constant as compared with the losses of etch rate inherent with ferric chloride solutions, simply by making a sufficient number of additions of small quantities of chlorides.

It will be noted in referring to Table 1, that the straight persulfates tended to etch out the highlight dots: ferric chloride in general gives etch factors of about 1 in this area, whereas in the case of the chloride additions the etch factors range from 1 up to 1.2.

Most significant are the results in the middle tones and the shadows where the persulfate straight runs from about 1 to 1.4 in the middletones and from 1.1 to 1.6 in the shadows: the ferric chloride runs from 1.4 to 1.6 in both the middletones and the shadows; and the persulfate with added chloride runs from 1.5 to as high as 2.3.

Moreover, it will be noted that greater depth of etch is obtained in the shadow and middle areas for the chloride catalyst persulfate solutions as compared with the ferric chloride solution. This is of real importance since it is precisely in these areas that the ink tends to bridge between the dots of the photoengraving and produce unwanted impressions.

Etch rates are somewhat slower in tray etching than in splash etching as would be expected from the fact that in tray etching the conditions are static as opposed to those dynamic conditions in splash etching. While the etch factors increase markedly on chloride addition with persulfate solutions, they are still not quite as good as those obtainable with ferric chloride. However, satisfactory etches are obtainable. With the more concentrated persulfate solutions in tray etching, the etch factors obtainable are somewhat poorer than those obtained with ferric chloride solution. At lower concentrations of persulfate of the order of 5 to 10% better etch factors can be obtained and completely satisfactory plates made.

In etching with persulfate in still trays, gas is evolved and will accumulate at the interface and bubbles result.

This can be overcome by the addition of a small amount of the order of 0.1 to 0.2% of a sulfur containing organic material such as thiourea, 2-naphthalene sulfonic acid, benzene sulfonic acid and other aryl sulfonic acids such as amino-2-naphthalene sulfonic acid and the di- and tri-benzene and naphthalene sulfonic acids.

As pointed out above the persulfate-chloride etches of this invention have certain marked advantages over the conventional ferric chloride etches previously used for the etching of copper photoengravings. They cost somewhat less. They are much more convenient to handle in that they are not corrosive and do not produce undesirable fumes. They are far easier to prepare and most important they give better depth of etch and improved etch factors in the critical middletones and shadow areas. Their only disadvantages are their need for analytical control and the need for the periodic additions of chloride if etch rate is to be maintained.

Obviously, changes can be made in the specific examples shown above without departing from the scope of the invention which is defined in the claims.

What is claimed is:

1. An etch solution for the etching of photoengraved plates comprising an aqueous solution containing from 5 to 50% of a water-soluble persulfate and from 1 to 20% of a water-soluble chloride from the group consisting of ammonium chloride and the alkali metal chlorides.

2. The etch solution of claim 1 containing in addition 0.1 to 0.2% of an aryl sulfonic acid.

3. The etch solution of claim 1 in which the water-soluble chloride is sodium chloride.

4. The etch solution of claim 1 in which the water-soluble chloride is ammonium chloride.

5. The method of etching a copper photoengraving while maintaining the etch rate at a high level which comprises initially etching the plate with a solution of an aqueous persulfate containing 5 to 50% of a water-soluble persulfate and also containing from 1 to 10% of a water-soluble chloride from the group consisting of ammonium chloride and the alkali metal chlorides, and, as the etch rate goes down as the copper content of the etch solution goes up, adding further of said water-soluble chloride in increments to maintain the etch rate.

6. The method of claim 5 in which the persulfate is ammonium persulfate.

7. The method of claim 5 in which the persulfate is sodium persulfate.

8. The method of claim 5 in which the water-soluble chloride is sodium chloride.

9. The method of claim 5 in which the water-soluble chloride is ammonium chloride.

References Cited by the Examiner

UNITED STATES PATENTS

| | | | |
|---|---|---|---|
| 2,746,848 | 5/1956 | Jones | 156—8 |
| 2,908,557 | 10/1959 | Black et al. | 156—19 |
| 2,978,301 | 2/1961 | Margulies et al. | 156—18 XR |
| 2,982,625 | 5/1961 | Saubestre | 156—18 XR |
| 3,023,138 | 2/1962 | Easley et al. | 156—14 |
| 3,033,793 | 5/1962 | Bradley et al. | 156—18 XR |
| 3,061,494 | 10/1962 | Snyder et al. | 252—79.4 X |
| 3,074,836 | 1/1963 | Sherer et al. | 156—8 |
| 3,083,129 | 3/1963 | Jones et al. | 156—19 |
| 3,137,600 | 6/1964 | Margulies et al. | 156—18 X |

ALEXANDER WYMAN, *Primary Examiner.*

EARL M. BERGERT, HAROLD ANSHER, *Examiners.*

UNITED STATES PATENT OFFICE

CERTIFICATE OF CORRECTION

Patent No. 3,216,873 November 9, 1965

Rexford W. Jones

It is hereby certified that error appears in the above numbered patent requiring correction and that the said Letters Patent should read as corrected below.

Column 2, line 71, for "hydrochloride" read -- hydrochloric --; column 4, line 16, for "pass" read -- loss --.

Signed and sealed this 20th day of September 1966.

(SEAL)
Attest:

ERNEST W. SWIDER
Attesting Officer

EDWARD J. BRENNER
Commissioner of Patents